United States Patent [19]

Blaum et al.

[11] Patent Number: 5,271,012
[45] Date of Patent: Dec. 14, 1993

[54] METHOD AND MEANS FOR ENCODING AND REBUILDING DATA CONTENTS OF UP TO TWO UNAVAILABLE DASDS IN AN ARRAY OF DASDS

[75] Inventors: Miguel M. Blaum, San Jose; Hsieh T. Hao, Los Altos; Richard L. Mattson; Jaishankar M. Menon, both of San Jose, all of Calif.

[73] Assignee: International Business Machines Corporation, Armonk, N.Y.

[21] Appl. No.: 653,596

[22] Filed: Feb. 11, 1991

[51] Int. Cl.$^5$ .................. G06F 11/10; G11B 20/18
[52] U.S. Cl. ........................... 371/101; 371/37.4
[58] Field of Search ............ 371/40.1, 51.1, 37.4, 371/50.1, 10.1, 10.2

[56] References Cited

U.S. PATENT DOCUMENTS

| | | | |
|---|---|---|---|
| 3,685,016 | 8/1972 | Eachus | 340/146.1 |
| 4,092,732 | 5/1978 | Ouchi | 364/900 |
| 4,201,976 | 5/1980 | Patel | 371/50 |
| 4,205,324 | 5/1980 | Patel | 371/50 |
| 4,796,260 | 1/1989 | Schilling et al. | 371/39 |
| 4,914,656 | 4/1990 | Dunphy, Jr. et al. | 371/10.2 |
| 4,993,030 | 2/1991 | Krakauer et al. | 371/40.1 |
| 5,022,030 | 6/1991 | Haugh | 371/51.1 |
| 5,130,992 | 7/1992 | Frey, Jr. et al. | 371/40.1 |

OTHER PUBLICATIONS

Lee, E., "Software and Performance Issues in the Implementation of a AID Prototype", Rept. No. UCB/CSD90/573, May 1990, pp. 1-35.

Patterson et al., "A Case for Redundant Arrays of Inexpensive Disks (RAID)" University of Calif. Berkeley report UCB/CSD 87/391, Published in Dec. 1987.

Prusinkiewicz and Budkowski, "A Double Track Error Correction Code for Magnetic Tape". IEEE Trans. on Computers, pp. 642-645, Jun. 1976.

"Providing Fault Tolerance In Parallel Secondary Storage Systems", Park, et al., Princeton University, CS-TR-057-86, Nov. 7, 1986.

*Primary Examiner*—Stephen M. Baker
*Attorney, Agent, or Firm*—R. Bruce Brodie

[57] ABSTRACT

A method and means for encoding data written onto an array of M synchronous DASDs and for rebuilding onto spare DASD array capacity when up to two array DASD fail. Data is mapped into the DASD array using an $(M-1)*M$ data array as the storage model where M is a prime number. Pairs of simple parities are recursively encoded over data in respective diagonal major and intersecting row major order array directions. The encoding traverse covering a topologically cylindrical path. Rebuilding data upon unavailability of no more than two DASDs merely requires accessing the data array and repeating the encoding step where the diagonals are oppositely sloped and writing the rebuilt array back to onto M DASDs inclusive of the spare capacity.

10 Claims, 2 Drawing Sheets

ELEMENTS OF A DASD ARRAY

ELEMENTS OF A DASD ARRAY
FIG. 1

PARITY ENCODING (M-1)*M DATA ARRAY

FIG. 2

METHOD AND MEANS FOR ENCODING AND REBUILDING DATA CONTENTS OF UP TO TWO UNAVAILABLE DASDS IN AN ARRAY OF DASDS

FIELD OF THE INVENTION

This invention relates to arrays of failure independent direct access storage devices (DASDs), and more particularly, to maintaining availability of data stored on said DASD arrays.

DESCRIPTION OF RELATED ART

Patterson et al, "A Case for Redundant Arrays of Inexpensive Disks (RAID)", University of California Berkeley Report UCB/CSD 87/391, published in 12/1987, and the references cited therein point out that availability of data in any storage system is a function of data errors and erasures, information redundancy, storage device redundancy, the policy of substituting available spare for failed storage, and the manner of reconstituting data on substitute storage. This applies with particularity to DASD arrays.

THE CONCEPT OF ARRAY

One processor view of external storage is to consider a very large logical DASD with logical tracks thereon. Each logical track would be many times larger than the physical track extent of any of the physical DASDs forming the external store (DASD array). It would be convenient to consider data in any logical track as a series of bits, bytes, or blocks mapped onto logical space of rows and columns for error correction coding and reconstruction purposes. The mapping from the logical track in array form to the physical array is one of the concerns to be subsequently exploited in this invention.

Mathematically an "array" is a subscripted variable in which the subscript indexes the relative position order of each instance of the variable; specifically, the position order of each bit, byte, or block in a logical track. The components of the subscript also define the dimensions of the array. Thus, array $A(i,j)$ specifies a variable "A" whose relative positions are mapped onto a two dimensional closed integer intervals $(1,1 < (i,j) < N,K)$.

— —The array dimensions may be mutually exclusive. Thus, the dimensions represented by the closed integer intervals $1 < i < N$ and $1 < j < K$ could denote an ordering (indexing) of like devices and time respectively, N and K being integer upper bounds. By convention, column order designates one array dimension and row order designates the other. In this regard, N is the number of DASDs and K is the number of bits, bytes, or blocks per DASD per track thereof.

A "DASD array" comprises a set of synchronously selected and operated DASDs. These are used where information is exchanged at a high data rate between fast processors and external storage. Serial to parallel mapping of data blocked at some predetermined size (byte, word, block) sustains the high data rate. The synchronous behavior requires N DASDs to rotate at the same rpm, have the same angular offset, and be simultaneously accessed in an identical manner. This solution while maximizing data transfer rate minimizes concurrency.

DASD Arrays and Some of Their Attributes

A "DASD array" is a form of external storage which attaches a processor or processor array at their input-/output (I/O) boundary over a broadband data and control path. More particularly, a DASD array is any set of logically related DASDs operable by common mode or means where the set of DASDs are synchronously selected and operated. DASD arrays exhibit characteristics supporting a high data rate, large logical track size, and very high availability.

The high data rate requires synchronous accessing of DASDs. Also, required is the serial to parallel mapping of data blocked at some predetermined size (bit, byte, word, block, record) across a counterpart group of DASDs in the write access direction and the parallel to serial mapping in the read access direction. The mapping is termed "interleaving" or "striping".

The synchronous behavior requires N DASDs to rotate at the same rpm, have the same angular offset, and be simultaneously accessed in an identical manner. This solution while maximizing data transfer rate minimizes concurrency.

Information Redundancy, Coding, and Blocking

As described by Patterson, data stored on N DASDs, if completely duplicated, would require a total of 2N devices. If it is anticipated that no more than an upper bound of data would be made unavailable due to DASD failure, noise or burst error, or inadvertent erasure, then some form of algebraic coding could be used instead of merely duplicating the data.

It is well known that algebraic coding occupies only a fraction of the DASD space as that occupied by mirrored data. Indeed, depending on the code employed, some 85% or more of the DASD space may be made available for storage of primary data. For instance, with simple parity coding (XORing), an arbitrarily small amount of space need be reserved e.g. parity could be taken over 10 blocks or 20 blocks. Thus, only 1 DASD in a 10 or 20 DASD group would have to be set aside.

There are many types of algebraic codes which can be used for the detection and/or correction of faulty or absent data. By this is meant, that some codes can be used to determine not only the value of data in error but the value of erased data. Also, the code selected has an intimate relationship with the other technical and economic aspects of availability. For example, Park et al, "Providing Fault Tolerance in Parallel Secondary Storage Systems", Princeton University Report CS-TR-057-86, published Nov. 7, 1986, as well as Patterson, point out that Hamming codes require more DASDs in a bit interleaved or striped group than a simple parity code would.

Segmenting (Striping), Simple Parity, and Data Redo

Typically, when a data stream is either first written to a DASD string or array or updated, one or more code characters are calculated from the data stream. Concurrently, the data stream is then segmented into N blocks and written across N DASDs while the algebraic coded characters are written to a N+1 DASD.

This method is exemplified by Ouchi, U.S. Pat. No. 4,092,732, "System for Recovering Data Stored in a Failed Memory Unit", issued May 30, 1978. Ouchi first disclose file into N data blocks, forming a parity block by exclusive OR'ing (XORing) the contents of the N data blocks, and then writing the data and parity blocks across N+1 failure independent DASDs.

According to Ouchi, the contents from any single inaccessible DASD can be recovered by XORing the parity blocks with the blocks stored on the N remaining accessible DASDs. As Patterson points out, one of the attractive aspects of simple parity encoding is that for each write update operation the parity can be recalculated as the XORing of the old block, the changed block and the old parity.

DASD Redundancy, Sparing, and Data Reconstruction

In addition to data redundancy and the related extra DASD space, availability of an array also involves redundancy in DASDs. These redundant DASDs are called "spares". In this regard, Dunphy et al, U.S. Pat. No. 4,914,656, "Disk Drive Memory", issued Apr. 3, 1990, reserves a predetermined number of formatted DASDs termed "hot spares" as an unassigned pool. When a single DASD fails in any of multiple independently addressable groups of synchronous DASDs, then one of the spares switchably replaces it. The problem of reconstituting the information on the replaced DASD remains.

Dunphy segments each data string applied to his array, calculates parity over the segments, and writes the segments +parity to counterpart N DASDs of one of the selected synchronous DASD groups. A single DASD failure permits data from the failed DASD to be recomputed from the remaining N−1 DASDs in that group.

The scheduling of the recomputation or reconstruction of missing data involves a trade off between maintenance of throughput and the risk of the array subsystem being rendered unavailable should another failure occur in the same group during the data redo period.

DASD Array Fault Tolerant Mode and Degraded Mode Operation

Fault tolerance refers to capability of a system to endure failure and continue operations without loss of availability. The interval subsequent to the occurrence of any failure and prior to returning the array to its former information state is denoted as degraded mode operation.

In the Ouchi and Dunphy systems, if the parity DASD failed, it would be possible to access data without any noticeable change in throughput. However, if a data DASD failed, throughput would drastically drop since each access would require recomputation of the affected data from the remaining data and the parity DASDs. Absent sparing and data redo, any second failure renders the data unavailable.

The Two Meanings of Parity Group

As used in the above identified Dunphy patent, "parity group" denotes a logical association of N DASDs including at least a (N+1)st DASD dedicated to storing parity taken thereacross. However, the term also refers to a logical association of data blocks and a parity or other algebraic coded redundant block taken thereacross. Patterson uses the latter definition in discussion of the RAID type 5 DASD array.

Data Error and Erasure

"Data error" in the storage context means any change in stored value as a consequence of a random noise or burst process. In systems storing binary values such as 1 1 1 0 0 1 0 0, remanent magnetization states change such that some 1's become 0's and some 0's become 1's. This might appear as 1 1 0 0 0 1 0 1. Here, the values in the 3rd and 8th positions from the left are random errors. A run of errors due to a burst source might appear as 1 1 1 1 1 1 1 0. Note, while the first seven consecutive positions were overwritten, only positions 3 through 7 are actually in error.

"Erasure" is the removal of any data value in a storage location. For example, the data string 1 x x x x 1 0 0 omits any binary values in positions 2 through 5.

Parity and Other Algebraic Codes

Algebraic coding is replete with many codes of elaboration and power to detect and correct errors in different data contexts. Among the latter are communication over noisy channels and recording of interleaved bits, bytes, or blocks on DASD arrays. For reasons of processing simplicity and minimization of redundant storage, many authors have utilized simple parity codes. This was described in the above named Ouchi patent.

It is known that detection and correction of errors of data disposed in finite and semi-infinite arrays using simple parity codes could be enhanced by taking parity diagonally and transversely across a data array as well as longitudinally. These parity codes are of the block type meaning that the actions taken with respect to one finite array are independent of the actions taken in its neighbors. This avoids the propagation of error or mistake from block to block as may be possible in codes of the cyclic type.

Prior Art Parity Codes Used in Block and Convolutional Codes

Eachus, U.S. Pat. No. 3,685,016, "Array Method And Apparatus For Encoding Detecting And/Or Correcting Data", issued Aug. 15, 1972, discloses a majority logic error detection method as applied over near infinite strings of convolutional coded data. In Eachus, an N*K data array uses a decode of a first check segment over N bits as a series of XOR additions along each column of the array, N being a prime number. Eachus also discloses the decoding of second and third check segments over N bits as a series of XOR additions along a series of respective left and right diagonals taken across the array.

Reference should be made to Patel, U.S. Pat. No. 4,201,976, "Plural Channel Error Correcting Methods And Means Using Adaptive Reallocation Of Redundant Channels Among Groups Of Channels", issued May 6, 1980 and Patel, U.S. Pat. No. 4,205,324, "Simultaneously Correcting Several Channels In Error In A Parallel Multi Channel Data System Using Continuously Modifiable Syndromes And Selective Generation Of Internal Channel Pointers", issued May 27, 1980. These patents extended Eachus through the use of spare rows and columns. The rows supported diagonal and transverse parity to enhance error correction in a multiple track magnetic tape stored data system.

Patel's methods were based upon Prusinkiewicz and Budkowski, "A Double Track Error Correction Code for Magnetic Tape", IEEE Trans. on Computers", pp 642-645, June 1976. It constitutes a cyclic code defined over a near infinite field i.e. a convolution code over an infinite tape. Patel added a second diagonal. Disadvantageously, an error in the convolutional code propagates throughout the encoded sequence, however long. Block codes limit error propagation to the individual length.

Schilling et al, U.S. Pat. No. 4,796,260, "Schilling-Manela Forward Error Correction and Detection Code Method and Apparatus", issued Jan. 3, 1989 discloses the use of two sets of differently sloped diagonal parity determinations over an arbitrarily sized G*H data array.

Gibson et al, "Coding Techniques for Handling Failures in Large Disk Arrays, Report No: UCB/CSD 88/477, University of California, Berkeley, December 1988, describes simple parity coding along the row and column disk projections of a data array at pages 6 and 7 correcting up to two DASD failures.

Small Write Operations

Numerically intensive applications involve passing long streams of data to and from an array. However, transaction processing usually uses a large number of different but short data streams. The passing of short data streams between a processor and external storage or DASD array is denominated "small read" and "small write" operations. Write operations typically involve up to six steps including reading the old data and old parity, computing new parity as a function of the old data, old parity, and new data, writing the new data and new parity to the DASD array, and a verify read after write. Usually, small read and write operations involve less than all of the DASDs in an array.

SUMMARY OF THE INVENTION

It is an object of this invention to devise a method and means for enhancing the availability of a DASD array in the presence of data errors, erasures, and DASD failures.

It is a related object to devise a method and means for encoding and rebuilding of the data contents including erasures of up to two unavailable DASDs in an array of M DASDs.

It is still another object to devise a method and means (1) to permit degraded mode operation even in the presence of a second DASD failure and (2) devise a method of simple parity group coding and data rebuilding on a spare DASD that returns the DASD array to fault tolerance.

Other related objects include (3) use of simple parity encoding and decoding or XOR operations thereby avoiding algebraic operations over finite fields as found in Reed-Solomon codes, (4) execute only XOR parity coding over the block rather than convolutional type coding as described in Patel, and (5) reduction in the number of operations associated with executing a write update and simple parity encoding.

The foregoing objects are satisfied by a method and means comprising the steps of (a) recursively simple parity encoding over a data array of critical dimension following a zig/zag and wrap around traverse; (b) striping and writing the parity coded data array to a DASD array; and (c) responsive to up to two DASD failures, rebuilding the data on a patterned or random basis by accessing the data array and repeating steps (a) and (b) where the traverse is but slightly modified to take the unavailable DASDs into account.

More, particularly, the method steps include recursively generating pairs of simple parity encodings over bits within an M−1)*M data bit array inclusive of said parity encodings. The generation taking place in respective diagonal major and row major order covering the data array as a topological cylinder. That is, one parity encoding is taken over each diagonal and one parity encoding is taken over the row intersecting the diagonal parity. The array dimension M must be a prime number.

The term topological cylinder denotes the abstract geometric surface defined by the coding (coding and decoding) traverse of the (M−1)*M data array.

Next, at completion of coding the data array or portions thereof M bits at a time in diagonal major order are striped and written to counterpart ones of M failure independent DASDs. Lastly, responsive to the unavailability of up to two DASDs, unavailable data is rebuilt from no less than (M−2) available DASDs by accessing the data array inclusive of erasures and repeating steps (a) and (b) on a scheduled or opportunistic basis in the same manner as the parity coding was originally processed.

It should be appreciated that the (M−1)*M array is one in which each row and diagonal exhibits even parity. Bits forming a referenced byte for instance are read diagonally instead of horizontally. Arbitrarily, a traverse would start in the upper left hand corner defining thereby M diagonals. With such double coded parity and traversal, it follows that such an (M−1)*M array code can correct any byte if and only if M is a prime.

Advantageously, small or short writes to the array use substantially the same method steps as that defined for simple parity encoding and data redo. For this reason, the number of operations/update can be kept to a minimum.

If the array reserves several DASDs as spares or otherwise reserves space on the DASDs within the array, then spares may be substituted for failed DASDs and rebuilt data written to the M DASD array inclusive of the spares.

Lastly, the method and means of the invention may be practiced on DASD arrays whether or not synchronized. In the latter case, the throughput is not as high as in the former case.

DESCRIPTION OF THE PREFERRED EMBODIMENT

An Overview of Reading and Writing to the DASD Array

Figure 1:
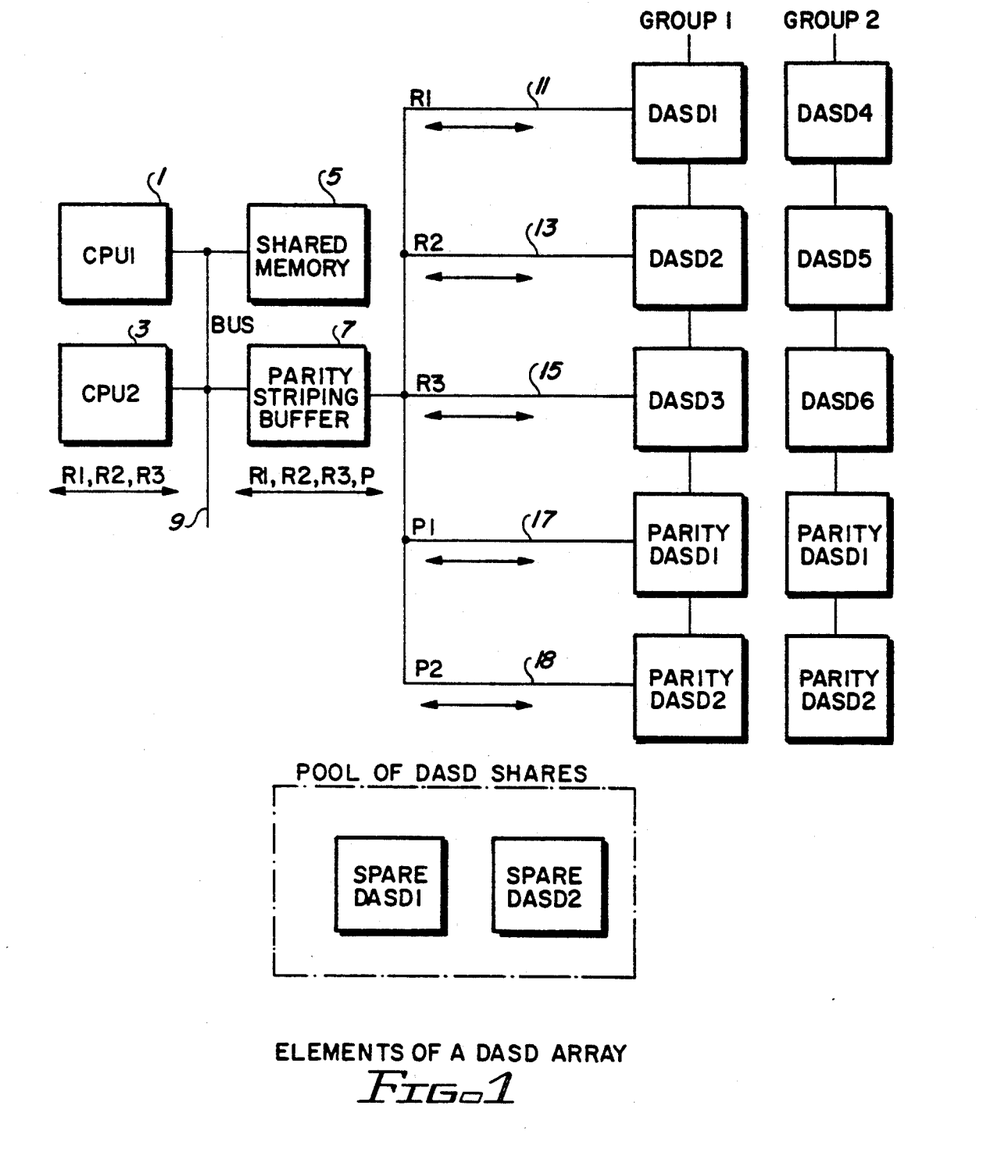
FIG. 1 shows a synchronous DASD array illustrating striping, parity encoding, sparing, and data redo on spares.

Referring now to FIG. 1, there is shown an array comprising a first and second DASD parity group coupling an intelligent parity generating and striping buffer (PSB) 7 over parallel paths 11, 13, 15, and 17. A processor array formed from CPU1 and CPU2 is coupled to data and control bus 9.

Processor 1 or 3 originated read and write commands establish a table directed access path to a parity group of DASDs by way of a standard accessing protocol and data movement over bus 9 shared memory 5 to PSB 7. The logical processing of a logical files is executed at PSB 7. In this regard, logical processing includes both striping (serial/parallel conversion of data) and parity generation and checking. The paths to and from the DASDs are table directed. In principle, an address specified in a read or write argument is translated by the PSB 7 via an array storage address table into the actual physical path between PSB 7 and the location on the DASDs of the requisite parity group.

To execute a write command, PSB 7 must first buffer the new data from the processor, read and buffer the (M−1)*M data array from the DASD parity group within which the striped or interleaved elements of the block are to be written, recursively recompute the array including new designated diagonal and row parities taking the old data, old parity, and new data into account, and then rewrite the modified data array back onto the DASD parity group.

For a read operation, PSB 7 responsive to a read command from a processor performs inverse operation sequence to that of writing. That is, the data array within which the data to be read must be extracted is buffered in PSB 7, appropriate row and diagonal parities tested, and the addressed data transferred across bus 9 to shared memory 5.

DASD Failure and Hot Sparing

In the event that a DASD failure occurs while read accessing data, PSB 7 can select one from a number of alternatives. These include regenerating corrupted data on-the-fly either by either (1) retry of the read command or (2) reconstruction of the data from remaining DASDs and replacement according to the method of the invention.

With respect to the processor 1 or 3 originating the read command, one strategy is to notify it of the failure occurrence only AFTER completion of the read data movement. This would permit the processor to control substitution of a spare DASD from a pool or from a DASD reserved exclusively to each parity group in the manner of Park et al. Responsive to processor commands such as DISABLE and RECONSTRUCT, PSB 7 can cause the failed DASD to be replaced with a designated spare DASD by table substituting the directory path to the spare for the table directory path of the failed DASD. Next, the data on the failed DASD can be rebuilt on the designated spare DASD.

In one embodiment, PSB 7 stores a bit map of DASD availability and address map of the DASDs. In turn, the availability and address maps are referenced during the processing of each access command. Alterations to the maps may be originated by the processor using the DISABLE and RECONSTRUCT commands. In such an implementation, a permanent address is assigned to the SPARE DASD. Significantly, after failure notification, the processor 1 or 3 can address map of the DASDs. In turn, the availability and address maps are referenced during the processing of each access command. Alterations to the maps are originated by the processor using the DISABLE and RECONSTRUCT commands. The present implementation assigns a permanent address to the SPARE DASD.

Significantly, after failure notification, the processor can
 (1) elect to do nothing; OR
 (2) generate commands causing the addresses of the spare DASDs to be substituted for the addresses for up to two of the failed DASDs; AND
 (3) reconstruct the contents of up to two failed DASD on the assigned spares by modulo 2 addition of parities plus remaining data DASDs according to the reconstruction method set out below.

Note, the dynamic substitution of a spare formatted DASDs for other DASDs online is termed "hot sparing".

Flow Diagram of the Method of the Invention

Figure 2:
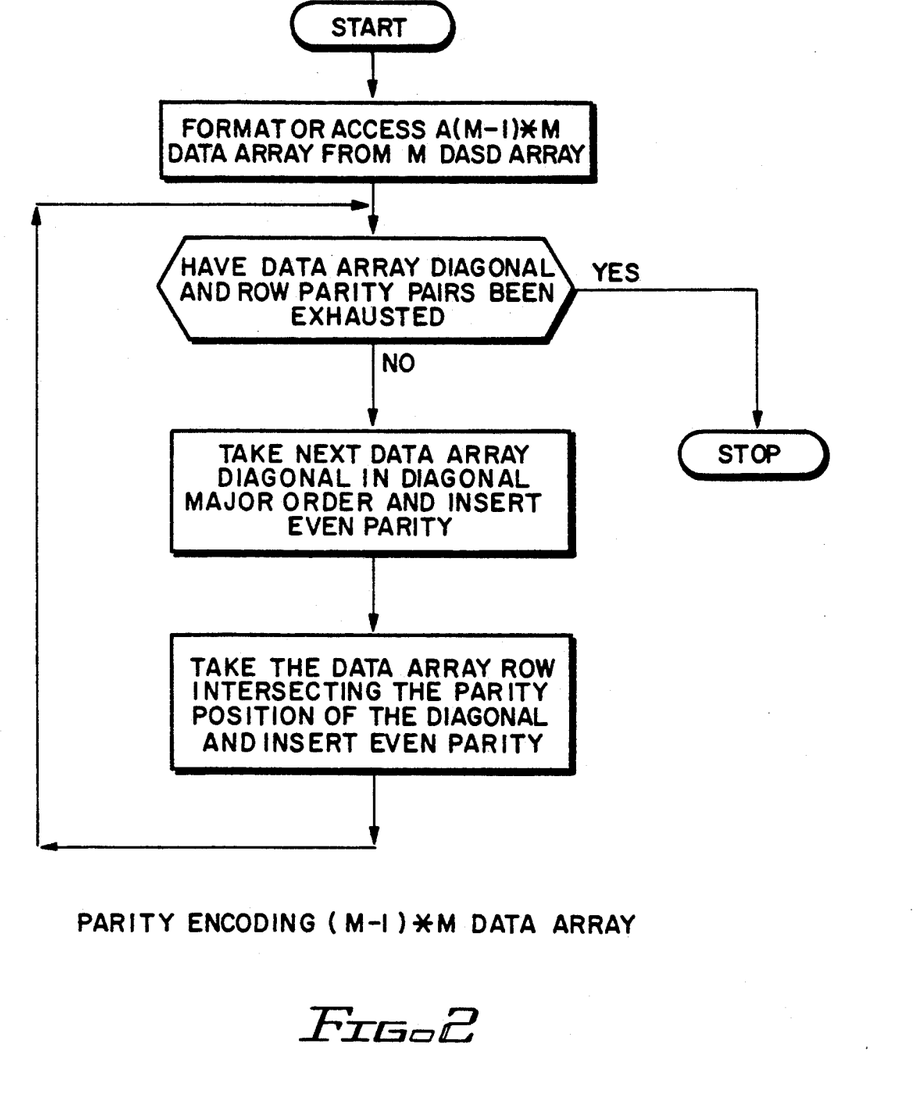
FIG. 2 is a flow diagram for encoding double parity using alternate rows and diagonals also depicting the action flow in recovering data from an array having double DASD failure.

Referring now to FIG. 2, there is shown a flow of the parity encoding steps over each (M−1)*M bit data array according to the method of the invention. Basically, pairs each formed from a positively sloped data array diagonal and an intersecting row are parity coded. This merely means that the bits on a diagonal are counted modulo 2 and the result placed in the available parity position. The bits of that array row intersecting the parity position of the diagonal are now counted modulo 2 and the result placed in a parity position available thereto. This process is repeated in diagonal and row major order until the data array has been covered.

The only difference in the action with respect to recovering or rebuilding data from up to two unavailable DASDs is that after the data array inclusive of erasures is accessed from no less than M−2 DASDs.

Encoding According to the Invention by Way of Example

In both the encoding and decoding/reconstruction examples to follow, the DASD array comprises five synchronous DASDs C1-C5. C1, C2, and C3 are assigned to store data while C4 and C5 are reserved for storing simple parity. It is assumed that the array is bit interleaved. This means that three data bits and two parity bits (M=5) are read or written to C1-C5 at a time. Thus for M=5, the data array has the dimension 4*5.

Given an (M−1)*M data array where M=a prime number

|    | C1 | C2 | C3 | C4 | C5 |
|----|----|----|----|----|----|
| S1 | 1  | 0  | 1  | x  | x  |
| S2 | 1  | 1  | 1  | x  | x  |
| S3 | 1  | 1  | 0  | x  | x  |
| S4 | 0  | 1  | 1  | x  | x  |

Encoding Double Parity Using Alternate Row and Diagonals

The array is assumed to be wrapped around in the manner of a cylinder. Encoding involves repeated diagonal parity assignment followed by row parity assignment (Zig/Zag encoding). In reading the coding actions below, note that the result of an action is shown in the next consecutive diagram. Hence the results of step 1 are shown in the diagram accompanying step 2. Diagonals are taken in a positive sloping array direction (lower left to upper right).

A dummy row S5 is added to facilitate the conceptualization of the zig/zag and wrap around traverse.

|    | C1 | C2 | C3 | C4 | C5 | |
|----|----|----|----|----|----|-|
| S1 | 1  | 0  | 1  | x  | x  | Step 1: take the 1st diagonal S4C1, it intercepts the first parity encode position S1C4 and insert even parity in position S1C4. |
| S2 | 1  | 1  | 1  | x  | x  | |
| S3 | 0  | 1  | 0  | x  | x  | |
| S4 | 0  | 1  | 1  | x  | x  | |
| S5 | 0  | 0  | 0  | 0  | 0  | |

|    | C1 | C2 | C3 | C4 | C5 | |
|----|----|----|----|----|----|-|
| S1 | 1  | 0  | 1  | 0d | x  | Step 2: assign even parity for row S1 in position S1C5 |
| S2 | 1  | 1  | 1d | x  | x  | |
| S3 | 0  | 1d | 0  | x  | x  | |
| S4 | 0d | 1  | 1  | x  | x  | |
| S5 | 0  | 0  | 0  | 0  | 0  | |

|    | C1 | C2 | C3 | C4 | C5 | |
|----|----|----|----|----|----|-|
| S1 | 1  | 0  | 1  | 0d | 0  | Step 3: take the next diagonal S4C2 which intercepts the parity encode position S1C5 and insert even parity in position S2C4. |
| S2 | 1  | 1  | 1d | x  | x  | |
| S3 | 0  | 1d | 0  | x  | x  | |

-continued

| | C1 | C2 | C3 | C4 | C5 | |
|---|---|---|---|---|---|---|
| S4 | 0d | 1 | 1 | x | x | |
| S5 | 0 | 0 | 0 | 0 | 0 | |
| | C1 | C2 | C3 | C4 | C5 | Step 4: assign even parity for row S2 in position S2C5 |
| S1 | 1 | 0 | 1 | 0 | 0d | |
| S2 | 1 | 1 | 1 | 1d | x | |
| S3 | 0 | 1 | 0d | x | x | |
| S4 | 0 | 1d | 1 | x | x | |
| S5 | 0 | 0 | 0 | 0 | 0 | |
| | C1 | C2 | C3 | C4 | C5 | Step 5: take the next diagonal S4C3 which intercepts the position S2C5 and insert even parity in position S3C4. |
| S1 | 1 | 0 | 1 | 0 | 0d | |
| S2 | 1 | 1 | 1 | 1d | 0 | |
| S3 | 0 | 1 | 0d | x | x | |
| S4 | 0 | 1d | 1 | x | x | |
| S5 | 0 | 0 | 0 | 0 | 0 | |

| | C1 | C2 | C3 | C4 | C5 | C1 | C2 | C3 | C4 | C5 | Step 6: assign even parity for row S3 in position S3C5. |
|---|---|---|---|---|---|---|---|---|---|---|---|
| S1 | 1 | 0 | 1 | 0 | 0 | 1d | 0 | 1 | 0 | 0 | |
| S2 | 1 | 1 | 1 | 1 | 0d | 1 | 1 | 1 | 1 | 0 | |
| S3 | 0 | 1 | 0 | 0d | x | 0 | 1 | 0 | 0 | x | |
| S4 | 0 | 1 | 1d | x | x | 0 | 1 | 1 | x | x | |
| S5 | 0 | 0 | 0 | 0 | 0 | 0 | 0 | 0 | 0 | 0 | |
| | C1 | C2 | C3 | C4 | C5 | C1 | C2 | C3 | C4 | C5 | Step 7: take the next diagonal S4C4 which intercepts the position S1C2 and insert even parity into S4C4. |
| S1 | 1 | 0 | 1 | 0 | 0 | 1d | 0 | 1 | 0 | 0 | |
| S2 | 1 | 1 | 1 | 1 | 0d | 1 | 1 | 1 | 1 | 0 | |
| S3 | 0 | 1 | 0 | 0d | 1 | 0 | 1 | 0 | 0 | 1 | |
| S4 | 0 | 1 | 1d | x | x | 0 | 1 | 1 | x | x | |
| S5 | 0 | 0 | 0 | 0 | 0 | 0 | 0 | 0 | 0 | 0 | |
| | C1 | C2 | C3 | C4 | C5 | C1 | C2 | C3 | C4 | C5 | Step 8: assign even parity for row S4 at position S4C5. |
| S1 | 1 | 0 | 1 | 0 | 0 | 1 | 0d | 1 | 0 | 0 | |
| S2 | 1 | 1 | 1 | 1 | 0 | 1d | 1 | 1 | 1 | 0 | |
| S3 | 0 | 1 | 0 | 0 | 1d | 0 | 1 | 0 | 0 | 1 | |

| | C1 | C2 | C3 | C4 | C5 | C1 | C2 | C3 | C4 | C5 | Encoding completed. |
|---|---|---|---|---|---|---|---|---|---|---|---|
| S4 | 0 | 1 | 1 | 0d | x | 0 | 1 | 1 | 0 | x | |
| S5 | 0 | 0 | 0 | 0 | 0 | 0 | 0 | 0 | 0 | 0 | |
| | C1 | C2 | C3 | C4 | C5 | C1 | C2 | C3 | C4 | C5 | |
| S1 | 1 | 0 | 1 | 0 | 0 | 1 | 0d | 1 | 0 | 0 | |
| S2 | 1 | 1 | 1 | 1 | 0 | 1d | 1 | 1 | 1 | 0 | |
| S3 | 0 | 1 | 0 | 0 | 1d | 0 | 1 | 0 | 0 | 1 | |
| S4 | 0 | 1 | 1 | 0d | 0 | 0 | 1 | 1 | 0 | 0 | |
| S5 | 0 | 0 | 0 | 0 | 0 | 0 | 0 | 0 | 0 | 0 | |

An equivalence to processing a prime number array can be achieved by processing a non-prime dimensioned array such as an 10*8 array appended by dummy columns filled with 0's can be added. Thus, a 10*8 array would be transformed into a 10*11 array by addition of 3 columns. Advantageously, it is known that errors can never occur in the added columns.

Data Recovery From Double DASD Failure

In this example, the (M−1)*M data array is assumed to be encoded according to the coding method of the invention. Note again, the effect of a reconstruction or decoding step is shown in the figure accompanying the next step. To start the process, the first diagonal selected is that positively sloped diagonal intersecting the first missing leftmost column to its immediate left.

Assume that DASD's C2 and C5 were unavailable:

| | C1 | C2 | C3 | C4 | C5 | | | | | | A dummy row S5 is added to facilitate comprehension of the traverse. |
|---|---|---|---|---|---|---|---|---|---|---|---|
| S1 | 1 | x | 1 | 0 | x | | | | | | |
| S2 | 1 | x | 1 | 1 | x | | | | | | |
| S3 | 0 | x | 0 | 0 | x | | | | | | |
| S4 | 0 | x | 1 | 0 | x | | | | | | |
| | C1 | C2 | C3 | C4 | C5 | C1 | C2 | C3 | C4 | C5 | Step 1 take a diagonal S4C3-S1C1 and insert even parity p at S2C5. |
| S1 | 1 | x | 1 | 0 | x | 1d | X | 1 | 0 | X | |
| S2 | 1 | x | 1 | 1 | xd | 1 | X | 1 | 1 | X | |
| S3 | 0 | x | 0 | 0d | x | 0 | X | 0 | 0 | X | |
| S4 | 0 | x | 1d | 0 | x | 0 | X | 1 | 0 | X | |
| S5 | 0 | 0d | 0 | 0 | 0 | 0 | 0 | 0 | 0 | 0 | |
| | C1 | C2 | C3 | C4 | C5 | C1 | C2 | C3 | C4 | C5 | Step 2 take the row S2 intersecting the diagonal parity and insert even parity p at S2C2. |
| S1 | 1 | x | 1 | 0 | x | 1d | X | 1 | 0 | X | |
| S2 | 1 | x | 1 | 1 | 0dp | 1 | X | 1 | 1 | 0p | |
| S3 | 0 | x | 0 | 0d | x | 0 | X | 0 | 0 | X | |
| S4 | 0 | x | 1d | 0 | x | 0 | X | 1 | 0 | X | |
| S5 | 0 | 0d | 0 | 0 | 0 | 0 | 0 | 0 | 0 | 0 | |
| | C1 | C2 | C3 | C4 | C5 | C1 | C2 | C3 | C4 | C5 | Step 3 take the diagonal S4C5-S1C3 which intercepts row S2 at S2C2 and insert even parity p at S4C5. |
| S1 | 1 | x | 1 | 0 | x | 1 | X | 1d | 0 | X | |
| S2 | 1 | 1p | 1 | 1 | 0 | 1 | 1dp | 1 | 1 | 0 | |
| S3 | 0 | x | 0 | 0 | x | 0d | X | 0 | 0 | X | |
| S4 | 0 | x | 1 | 0 | xd | 0 | X | 1 | 0 | X | |
| S5 | 0 | 0 | 0 | 0d | 0 | 0 | 0 | 0 | 0 | 0 | |
| | C1 | C2 | C3 | C4 | C5 | C1 | C2 | C3 | C4 | C5 | Step 4 take the row S4 which intercepts diagonal parity and insert even parity p at S4C2. |
| S1 | 1 | x | 1 | 0 | x | 1 | X | 1d | 0 | X | |
| S2 | 1 | 1 | 1 | 1 | 0 | 1 | 1d | 1 | 1 | 0 | |
| S3 | 0 | x | 0 | 0 | x | 0d | X | 0 | 0 | X | |
| S4 | 0 | x | 1 | 0 | 0dp | 0 | X | 1 | 0 | 0p | |
| S5 | 0 | 0 | 0 | 0d | 0 | 0 | 0 | 0 | 0 | 0 | |
| | C1 | C2 | C3 | C4 | C5 | C1 | C2 | C3 | C4 | C5 | Step 5 take the diagonal S4C2-S1C5 which intercepts row S4 at S4C2 and insert even parity p at S1C5. |
| S1 | 1 | x | 1 | 0 | x | 1 | X | 1d | 0 | X | |
| S2 | 1 | 1 | 1 | 1 | 0 | 1 | 1d | 1 | 1 | 0 | |
| S3 | 0 | x | 0 | 0 | x | 0d | X | 0 | 0 | X | |
| S4 | 0 | 1p | 1 | 0 | 0d | 0 | 1p | 1 | 0 | 0 | |
| S5 | 0 | 0 | 0 | 0d | 0 | 0 | 0 | 0 | 0 | 0 | |
| | C1 | C2 | C3 | C4 | C5 | C1 | C2 | C3 | C4 | C5 | Step 6 take the row S1 which intercepts diagonal parity at S1C5 and insert even parity p at S1C2. |
| S1 | 1 | x | 1 | 0 | 0p | 1 | X | 1 | 0 | 0dp | |
| S2 | 1 | 1 | 1 | 1 | 0 | 1 | 1 | 1 | 1d | 0 | |
| S3 | 0 | x | 0 | 0 | x | 0 | X | 0d | 0 | X | |
| S4 | 0 | 1 | 1 | 0 | 0 | 0 | 1d | 1 | 0 | 0 | |
| S5 | 0 | 0 | 0 | 0 | 0 | 0d | 0 | 0 | 0 | 0 | |
| | C1 | C2 | C3 | C4 | C5 | C1 | C2 | C3 | C4 | C5 | Step 7 take the diagonal S4C4-S1C2 which intercepts row S1 at S1C2 and insert even parity p at S3C5. |
| S1 | 1 | 0p | 1 | 0 | 0 | 1 | 0p | 1 | 0 | 0d | |
| S2 | 1 | 1 | 1 | 1 | 0 | 1 | 1 | 1 | 1d | 0 | |
| S3 | 0 | x | 0 | 0 | x | 0 | X | 0d | 0 | X | |
| S4 | 0 | 1 | 1 | 0 | 0 | 0 | 1d | 1 | 0 | 0 | |
| S5 | 0 | 0 | 0 | 0 | 0 | 0d | 0 | 0 | 0 | 0 | |
| | C1 | C2 | C3 | C4 | C5 | C1 | C2 | C3 | C4 | C5 | Step 8 take the row S3 which intercepts diagonal |
| S1 | 1 | 0 | 1 | 0 | 0 | 1 | 0d | 1 | 0 | 0 | |

|    | C1 | C2 | C3 | C4 | C5 |    | C1 | C2 | C3 | C4 | C5 |                              |
|----|----|----|----|----|----|----|----|----|----|----|----|------------------------------|
| S2 | 1  | 1  | 1  | 1  | 0  | 1d | 1  |    | 1  | 1  | 0  | parity at S3C5 and insert    |
| S3 | 0  | x  | 0  | 0  | 1dp| 0  | X  |    | 0  | 0  | 1p | even parity p at S3C2.       |
| S4 | 0  | 1  | 1  | 0d | 0  |    | 0  | 1  | 1  | 0  | 0  |                              |
| S5 | 0  | 0  | 0d | 0  | 0  |    | 0  | 0  | 0  | 0  | 0  |                              |
|    | C1 | C2 | C3 | C4 | C5 |    | C1 | C2 | C3 | C4 | C5 | Data Recovery Completed      |
| S1 | 1  | 0  | 1  | 0  | 0  |    | 1  | 0d | 1  | 0  | 0  |                              |
| S2 | 1  | 1  | 1  | 1  | 0  |    | 1d | 1  | 1  | 1  | 0  |                              |
| S3 | 0  | 1p | 0  | 0  | 1d |    | 0  | 1p | 0  | 0  | 1  |                              |
| S4 | 0  | 1  | 1  | 0d | 0  |    | 0  | 1  | 1  | 0  | 0  |                              |
| S5 | 0  | 0  | 0d | 0  | 0  |    | 0  | 0  | 0  | 0  | 0  |                              |

It should be noted that the only difference between the parity encode and data redo is that in the former the last two DASDs C4 and C5 had to have values computed and written thereon while in the latter it was DASDs C2 and C5. In fact, the encoding is a particular case of the decoding aspects of the method of the invention.

A Small Write Using the Invention By Way of Example

As may be recalled, a small or short write operation may be that of replacing or update writing of several bits for instance on one of the DASD in an M DASD array. For example, given an (M−1)*M data bit array with row S5 being a dummy.

|    | C1 | C2 | C3 | C4 | C5 | It is desired to replace column C2 with |
|----|----|----|----|----|----|------------------------------------------|
| S1 | 1  | 1  | 1  | 0  | 1  | R1 = 0                                   |
| S2 | 0  | 0  | 0  | 0  | 0  | R2 = 1                                   |
| S3 | 1  | 1  | 0  | 0  | 0  | R3 = 1                                   |
| S4 | 1  | 1  | 1  | 1  | 0  | R4 = 0                                   |
| S5 | 0  | 0  | 0  | 0  | 0  | R5 = 0                                   |

In using the method f the invention, it is necessary to recompute both the row and diagonal parities taking into account the fact that the new parity s an XORing of the old datum, the old parity and the new datum.

The recomputed array where column C2 is replaced by R1-R5 appears as follows:

|    | C1 | C2 | C3 | C4 | C5 | The simple parities on C4 and C5 are |
|----|----|----|----|----|----|---------------------------------------|
| S1 | 1  | 0  | 1  | 0  | 0  | recomputed to reflect the update to C2. |
| S2 | 0  | 1  | 0  | 0  | 1  |                                       |
| S3 | 1  | 1  | 0  | 1  | 1  |                                       |
| S4 | 1  | 0  | 1  | 1  | 1  |                                       |
| S5 | 0  | 0  | 0  | 0  | 0  |                                       |

Let (x,y) be the data value at the array coordinates shown therein. Furthermore, let (x,y)' be the new array value.
Illustratively:
Calculation of new parity values (1,4)' := (1,4) XOR ((3,2) XOR (R3)) = 0 XOR (1 XOR 1) = 0
        old       old      new
        parity  datum datum (1,5)' := (1,5) XOR ((1,4) XOR (1,4)') XOR ((1,2) XOR (R1))
        old    adjacent  adjacent  old    new
        parity  old      new      datum datum
                 parity   parity
    = 1 XOR (0 XOR 0) XOR (1 XOR 0) = 0

(4,5)' := (4,5) XOR ((4,4) XOR (4,4)') XOR ((2,2) XOR (R2))
        old    adjacent  adjacent  old    new
        parity  old      new      datum datum
                 parity   parity
    = 0 XOR (1 XOR 1) XOR (0 XOR 1) = 1

These and other extensions of the invention may be made without departing from the spirit and scope thereof as recited in the appended claims

What is claimed is:

1. A method for encoding and rebuilding of the data contents of up to two unavailable DASD's form an array of a M failure independent DASDs, comprising the steps of:

(a) simple parity encoding over a (M−1)*M bit data array following a cylindrical, zig/zag traverse, said encoding being defined over pairs each formed from an array diagonal and a row intersecting the parity assigned to the diagonal;

(b) striping and writing the parity coded data array to the M DASD array; and (c) responsive to up to two DASD failures, rebuilding the data on a patterned or random basis by accessing the data array and repeating steps (a) and (b) modified.

2. A method for encoding and rebuilding of the data contents of up to two unavailable DASD's from an array of M failure independent DASDs, comprising the steps of:

(a) recursively generating pairs of simple parity encodings over bits within an (M−1)*M data bit array inclusive of said parity encodings, said generation occurring in respective diagonal major order and row major order covering said array as a topological cylinder, one parity encoding over each diagonal and one parity encoding over the row intersecting the diagonal parity, M being a prime number;

(b) striping and writing M bits at a time in row major order to counterpart ones of M failure independent DASDs in the array; and (c) responsive to the unavailability of up to two DASDs, rebuilding the data from no less than (M−2) available DASDs by accessing the data array inclusive of erasures and repeating steps (a) and (b) on a scheduled or opportunistic basis.

3. The method according to claim 2, wherein said DASD array has spare capacity assigned thereamong in a predetermined manner, and further wherein the rebuilding step includes striping and writing the rebuilt data using the spare DASD array capacity in place of the unavailable DASDs.

4. The method according to claim 3, wherein the spare DASD capacity is in the form of DASDs reserved as spares.

5. A method for encoding and rebuilding the data contents of up to two unavailable DASDs of an M DASD array, comprising the steps of:

(a) block encoding and writing to counterpart locations on the M DASD array original data elements of an (M−1)*M data array, said encoding being executed in an alternating diagonal and row manner covering said data array as a topological cylinder, each diagonal and row encoding action resulting in a first and second simple parity (XOR), said first and second parity being stored on respective first and second failure independent ones of the M DASD array; and (b) responsive to the unavailability of no more than two DASDs, rebuilding the data from said unavailable DASD by simple parity coding of the referenced array elements from M−1 or M−2 other available DASDs on a scheduled or opportunistic basis on spare DASD array capacity by the dual of the encoding and writing process covering the data array as a topological cylinder.

6. The method according to claim 5, wherein if M is not a prime number than causing steps (a) and (b) being operative to behave as if the data array were expanded to include additional columns of uniform binary value to yield an effective array (M'−1)*M' where M' constitutes a prime number.

7. A computer implemented method for coding and rebuilding the contents of up to two unavailable DASDs in an M DASD array, said DASD array being attached to a computing system, comprising the steps of:
 (a) block encoding and writing onto said M DASD array at least one (M−1)*M data array of simple parity encoded data, said encoding being executed in alternating diagonal major wrap-around order and row major order, M being a prime number, each parity encoding along a data array diagonal intercepting M−2 data elements and the results being placed in a first position on a first one of the M DASD, each parity encoding along a data array row intersecting the first parity position and intercepting M−1 data elements and the results being placed in a second parity position in that row on a second one of the M DASD; and
 (b) responsive to accesses to any unavailable DASD, rebuilding the data from said unavailable DASD by simple parity coding of the referenced array elements from M−1 or M−2 other available DASDs on a scheduled or opportunistic basis on spare DASD array capacity by the dual of the encoding and writing process covering the data array in alternating diagonal major wrap-around order and row major order.

8. The method according to claim 7, wherein said computer executes at least one small write access to the (M−1)*M data array stored on the array of M DASDs, a first and a second DASD storing simple parity while M−2 other DASDs storing data, and wherein said method further comprises the steps of reading the old data from at least one data DASD and old parity from the first and second DASDs; determining the new parity (x,y)' to be written onto the respective first and second DASDs by XORing old data, new data, old parity, old adjacent parity and new adjacent parity.

9. In a system having a CPU, an array of at least M DASDs and spared thereof, and means intercoupling the CPU and the array for synchronously accessing selectable ones of the DASDs, said means including means for read and write accesses of M bits at a time striped over M DASDs, wherein said intercoupling means further comprise:
 (a) means for formatting an (M−1)*M data bit array inclusive of simple parity encodings onto M DASDs of the array in a recursively generated pattern of diagonal major and intersecting row major order, said order traversing a topological cylinder, M being a prime number; and
 (b) means responsive to the unavailability of up to two DASDs for rebuilding the data from no less than (M−2) available DASDs by accessing the data array and repeating steps (a) and (b) modified on a scheduled or opportunistic basis.

10. The system according to claim 9, wherein said array includes unassigned spare DASDs, and further, wherein said intercoupling means includes means for substituting spare DASDs for the failed ones and for writing back rebuild data across M DASDs including the substituted DASDs. to counterpart locations on the M DASD array original data elements of an (M−1)*M data array, said encoding being executed in an alternating diagonal and row manner covering said data array as a topological cylinder, each diagonal and row encoding action resulting in a first and second simple parity (XOR), said first and second parity being stored on respective first and second failure independent ones of the M DASD array; and
 (b) responsive to the unavailability of no more than two DASDs, rebuilding the data from said unavailable DASD by simple parity coding of the referenced array elements from M−1 or M−2 other available DASDs on a scheduled or opportunistic basis on spare DASD array capacity by the dual of the encoding and writing process covering the data array as a topological cylinder.

* * * * *

UNITED STATES PATENT AND TRADEMARK OFFICE
CERTIFICATE OF CORRECTION

PATENT NO. : 5,271,012
DATED : Dec. 14, 1993
INVENTOR(S) : M. Blaum, H. Hao, R. Mattson, J. Menon It is certified that error appears in the above-indentified patent and that said Letters Patent is hereby corrected as shown below:

Column 11, line 35 after "using the method" delete "f" and add --of--

Column 11, line 68 delete "form" and add --from--

Column 14, line 7, delete "spared" and add --spares--
Column 14, lines 31-46 delete "M DASD array......array as a topological cylinder."

Signed and Sealed this

Third Day of January, 1995

BRUCE LEHMAN

Attest:

Attesting Officer          Commissioner of Patents and Trademarks